United States Patent [19]

Holmes

[11] Patent Number: 5,500,606
[45] Date of Patent: Mar. 19, 1996

[54] COMPLETELY WIRELESS DUAL-ACCESS TEST FIXTURE

[75] Inventor: Frederick J. Holmes, Houston, Tex.

[73] Assignee: Compaq Computer Corporation, Houston, Tex.

[21] Appl. No.: 122,246

[22] Filed: Sep. 16, 1993

[51] Int. Cl.⁶ .................................................. G01R 31/02
[52] U.S. Cl. ........................... 324/761; 324/754; 324/758
[58] Field of Search .................................. 324/761, 754, 324/758

[56] References Cited

U.S. PATENT DOCUMENTS

| 3,970,934 | 7/1976 | Aksu | 324/761 |
| 4,099,120 | 7/1978 | Aksu | 324/761 |
| 5,087,878 | 2/1992 | Belmore, III et al. | 324/754 |
| 5,157,325 | 10/1992 | Murphy . | |

Primary Examiner—Kenneth A. Wieder
Assistant Examiner—Kourosh Cyrus Khosravi
Attorney, Agent, or Firm—Pravel, Hewitt, Kimball & Krieger

[57] ABSTRACT

A test fixture including top and bottom probe plates including double-ended pogo pins interfacing top and bottom interface printed circuit board (IPCBs), further including double-ended transfer pins to achieve a true wireless dual access test fixture. The top transfer pins electrically engage the bottom transfer pins after vacuum is applied to allow electrical interface with the top-side fixture without the use of wires. The top fixture mounts in a frame assembly through a parallel linkage keeping the top fixture parallel with the PCB under test. Guide pins mounted on the bottom probe plate are used to align a top plate holding the PCB and also to pre-align with bushings on the top fixture before vacuum is applied. When vacuum is applied, the top plate and top fixture move in a single longitudinal direction to electrically engage the test pins and test pads, preventing lateral movement which heretofore caused significant damage to the test pins and test pads.

2 Claims, 6 Drawing Sheets

COMPLETELY WIRELESS DUAL-ACCESS TEST FIXTURE

BACKGROUND OF THE INVENTION

1. Field of the Invention

The present invention concerns a completely wireless dual-access test fixture for interfacing a printed circuit board with a board tester.

2. Description of the Related Art

A test fixture is an apparatus designed for mounting and interfacing a printed circuit board (PCB) to be tested by a test and analysis apparatus, otherwise referred to as a board tester. In general, there are two basic types of testers, in-circuit testers for identifying or verifying electrical shorts, open-circuits, component tolerances and IC chip "clocking", and functional testers for verifying the appropriate functional operation of the PCB. An example of an in-circuit tester is the GENRAD 2272/2282 board tester. The present invention is primarily concerned with fixtures for in-circuit testers, although the invention may be equally applied to test fixtures for functional testers.

The purpose of a dual-access test fixture is to access test points or pads simultaneously on the top and bottom sides of the PCB under test. As the size of PCBs get smaller and become more densely populated with components, the test pads on the PCB consequently decrease in size. These smaller test pads require greater accuracy and much tighter tolerances of the fixture apparatus, since otherwise good PCBs would fail because of misalignment of the probes or pins with the pads for electrical interfacing. Furthermore, as the PCBs under test become more sophisticated, it is desirable and often necessary to test separate circuits on the bottom and top sides of the PCB. Several dual-access test fixtures have been implemented to solve some of the ever-increasing alignment problems, but many alignment problems still exist, especially due to the advent of smaller test pads.

The existing test fixtures have several deficiencies causing an inordinate percentages of failures. One major problem is the use of electrical wires in one form or another to complete electrical connections. The wires are typically in the form of wirewrap, where long, individual wires are used for each test connection, or ribbon cable coupled between the top and bottom fixtures and mounted to corresponding connectors.

Many false signal and noise problems arose when using wirewrap or ribbon cables to electrically connect test pins used to contact the test pads of the PCB under test. The wires add stray capacitance or inductively couple signals in nearby test wires, causing electrical noise and false signals. This problem has not been previously solved, so that the only method to achieve an accurate test on a high speed PCB was to reduce the frequency of the test. Frequency reduction is undesirable, since the test is not completely reliable at slower speeds. The most accurate and reliable test is performed at the true clock frequency.

U.S. Pat. No. 5,157,325 ('325), issued Oct. 20, 1992 to Murphy, discloses an existing version of "wireless" fixture technology, which is hereby incorporated by reference. In the so-called wireless technology of the '325 patent, specially designed test probes comprising doubled-ended pogo pins were mounted to a probe plate, where one side of the test pins would electrically contact or engage the test pads of the PCB under test, and where the opposite end of the test pins would electrically engage test pads on the surface of an interface PCB (IPCB). Two probe plates, each mounted with pogo pins, were provided on either side of the PCB under test. The other ends of the pogo or test pins on the bottom probe plate would electrically engage test pads on a bottom IPCB. The bottom IPCB also had rows of input/output (I/O) pads on its bottom side to electrically interface with I/O pins of the tester unit itself. Corresponding test pads formed on the upper and lower surfaces of the bottom IPCB were electrically connected together through conductive traces on and within the bottom IPCB. Thus, electrical connections were made between the test pads located on the bottom side of the PCB under test and the tester through the pogo pins on the bottom probe plate and the bottom IPCB.

On the top side of the PCB under test, the top probe plate was mounted with similar double-ended pogo pins, which were used in a similar manner to electrically engage test pads on the top side of the PCB under test to corresponding test pads on a top IPCB. The test pads on the top IPCB were electrically connected to a connector mounted on the top IPCB using routed traces on the top IPCB. One end of a ribbon cable was plugged into the connector, and the other end of the ribbon cable was plugged into a similar connector mounted on the bottom IPCB. The test fixture apparatus of the patent '325 was not a true wireless system due to the use of the ribbon cable. The ribbon cable also caused other problems. For example, when closing the fixture for testing, the ribbon cable would often get caught between the top and bottom frames, and would consequently break and need replacement. Worse yet, the internal wires would often be severed, resulting in a hidden defect which was very difficult to detect or debug. Further, breakage of the ribbon cable sometimes caused electrical shorts increasing the likelihood of electrical shock.

The previous dual-access wireless fixture described in the '325 patent used a handler having a separate top access "cassette" containing the top fixture assembly, and a separate bottom frame containing the bottom fixture assembly. The handler caused severe alignment problems resulting in an inordinate number of failures, damage to the PCB under test and also damage to the fixture itself. In particular, when using the old handler in the dual-access application, the top cassette was able to shift or slide relative to the bottom frame before vacuum was applied, causing misalignment and broken test probes. Although guide pins and bushings were used, they were not pre-aligned before vacuum was applied. When vacuum was applied, the top access cassette was forced into alignment while the test pins were in contact with the test pads of the PCB. Such forced shifting and alignment reduced the lifetime of the guide pins and bushings, and the test pins and test pads. Several adjustments and test cycles were likely for each test, resulting in greater test cycle times. The necessary adjustments sometimes involved manually shifting the upper cassette to force alignment, often resulting in damage to the PCB under test, the test pins or other parts of the fixture.

One inherent alignment problem with the existing dual-access fixture is that the top access cassette was pivoted with respect to the bottom frame along a common axis to close the fixture prior to testing. The top cassette was lowered on top of the PCB under test and bottom frame in a similar manner as a hood on a car or the lid of a top-loading washing machine. When vacuum was applied, the top access was forced further downwards, resulting in lateral movement due to the single pivot axis. Since the test pins would slide along the test pads of the PCB under test due to the lateral movement, the pins would undergo wiping action from the point where the pins first contacted the pads until its final test position. This sliding and scraping often caused bent or broken test probes and damage to the test pads on the PCB. Furthermore, many of the pins were often either misaligned, barely contacting the test pads, or not contacting the test pads at all.

Other methods were attempted to solve the inherent alignment problems. For example, parallel linkage techniques have been applied to raise and lower the top access relative to the bottom frame, using two or more links similar to the compartments in a tackle-box. Nonetheless, the mounting apparatus was still designed to pivot further to complete the alignment, so that the pivot motion, however slight, still occurred after vacuum was actuated causing significant lateral movement of the pins relative to the pads. The lateral movement caused stress on guide pins and bushings and further caused a wiping action of the test probes. These alignment problems always shortened cycle life of the fixture.

Another problem was tolerance stack-up, caused by separate spacers stacked in different layers of the fixture to achieve an aggregate distance. For example, one set of spacers would be used between the bottom IPCB and an alignment plate, and a separate set of spacers between the alignment plate and the probe plate to achieve an over-all aggregate distance between the bottom IPCB and the bottom probe plate. This distance is critical since it defines the compression ratio of the probe pins used to electrically engage test pads on the bottom IPCB. The separate spacers caused deformation of the alignment plate and the bottom IPCB, resulting in a non-uniform distance between the probe plate and bottom IPCB. Thus, the test pins were not uniformly compressed, so that some were compressed only slightly thereby compromising electrical integrity, while others were over-compressed thereby causing damage to the test pads or test pins.

It is desirable, therefore, to provide a dual access fixture without wires and with significantly improved alignment techniques. Eliminating the wires would allow test at full speed and reduced false signals, while improved alignment would reduce stress and breakage of the test pins and test pads.

SUMMARY OF THE PRESENT INVENTION

A test fixture according to the present invention is provided incorporating the dual-access capability without the use of wires. Furthermore, a test fixture according to the present invention substantially reduces misalignment difficulties by pre-aligning the top and bottom fixtures to allow longitudinal-only displacement of the top fixture and the PCB under test relative to the bottom fixture. Lateral or arcuate movement of the test pins relative to the test pads is eliminated. Thus, the test pins are longitudinally displaced to engage the test pads without arcuate or lateral motion when vacuum is applied. Also, one-piece hard stops assure uniform displacement between the probe plates and IPCBs.

A top access or top fixture comprises a top IPCB, an alignment plate, a spacer plate and a top probe plate mounted with the same or similar double-ended pogo pins as used in the prior wireless technique. The top probe plate includes a first set of test pins, having first ends which are aligned to electrically engage the printed circuit board (PCB) under test when vacuum is applied. The other ends of the top probe plate test pins are aligned to electrically engage test pads located on the top IPCB. The top probe plate also includes a second set of pogo pins, called transfer pins, having one end for electrically engaging transfer pads located on the top IPCB. The top IPCB is routed with electrical traces to connect the test pads to the transfer pads of the top IPCB.

A bottom fixture includes a bottom IPCB, an alignment plate and a bottom probe plate mounted together. One side of the bottom IPCB includes input/output (I/O) pads for electrically engaging the I/O pins of the tester apparatus. The other side of the bottom IPCB includes test pads for electrically interfacing with the test pads on the bottom side of the PCB under test, and transfer pads for electrically interfacing with the test pads on the top of the PCB under test through transfer pins. The bottom probe plate includes a first set of test pins, each having one end for electrically engaging the test pads on the bottom IPCB, and another end for electrically engaging corresponding test pads located on the bottom side of the PCB under test. The bottom probe plate also includes a second set of pogo pins, or transfer pins, each having one end for electrically engaging the transfer pads on the bottom IPCB, and another end for electrically engaging the transfer pins of the top probe plate.

In this manner, all of the test pads on the top and bottom side of the PCB under test are electrically interfaced through the test pins, transfer pins and top and bottom IPCB's to the I/O pins of the tester without the use of wires. This substantially reduces false signals due to stray capacitance or inductive coupling, allowing the test to be performed at higher frequencies. Furthermore, since the tests are more accurate, a significant increase in the percentage of good PCBs that pass is achieved.

The top fixture comprising the top IPCB, alignment plate, spacer plate and top probe plate sits in a frame assembly including a top frame plate mounted to a frame support. The top frame plate is preferably a rectangular and tubular shaped body having side walls for interfacing the top spacer. The top spacer preferably includes two strips of silicone foam for a vacuum fit inside the top frame plate. The frame support forms a shoulder upon which compression springs are provided. In this manner, the top fixture rests on the compression springs when placed into the top frame assembly.

The top frame assembly includes two rail supports provided on either side of the top frame plate, with two parallel links on either side having one end pivotally mounted to the top frame plate and the other end pivotally mounted to the rail supports. Furthermore, both rail supports are mounted directly to a top plate, upon which the PCB under test is mounted. Three guide pins mounted to the bottom probe plate extend through holes provided through the top plate to interface corresponding bushings provided on the top probe plate. The bottom probe plate also includes compression springs for supporting the top plate, and dress rails mounted on its circumference for receiving the top plate.

In this manner, the top frame plate is lowered to bring the top fixture in substantial alignment with the PCB under test. When the top frame plate is lowered, the frame support rests on the top plate holding the PCB, and the guide pins partially penetrate the bushings on the top probe plate. This establishes pre-alignment of the top fixture relative to the bottom fixture prior to vacuum actuation. When vacuum is applied, the top plate only moves longitudinally because of the guide pins, achieving electrical engagement of the test pins with the test pads on the bottom side of the PCB without any lateral movement. Also, since the top probe plate is pre-aligned because of the guide pins, the top fixture moves longitudinally downwards to electrically engage the test pads on the top of the PCB without lateral movement. The top transfer pins move longitudinally downwards to electrically engage the bottom transfer pins upon vacuum actuation.

Other improvements also increase the accuracy and reliability of the test. One-piece hard stops mounted to the IPCBs assure that the critical distance between the probe plates and the respective IPCBs is maintained, to provide the desired compression of all of the test pins.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1:
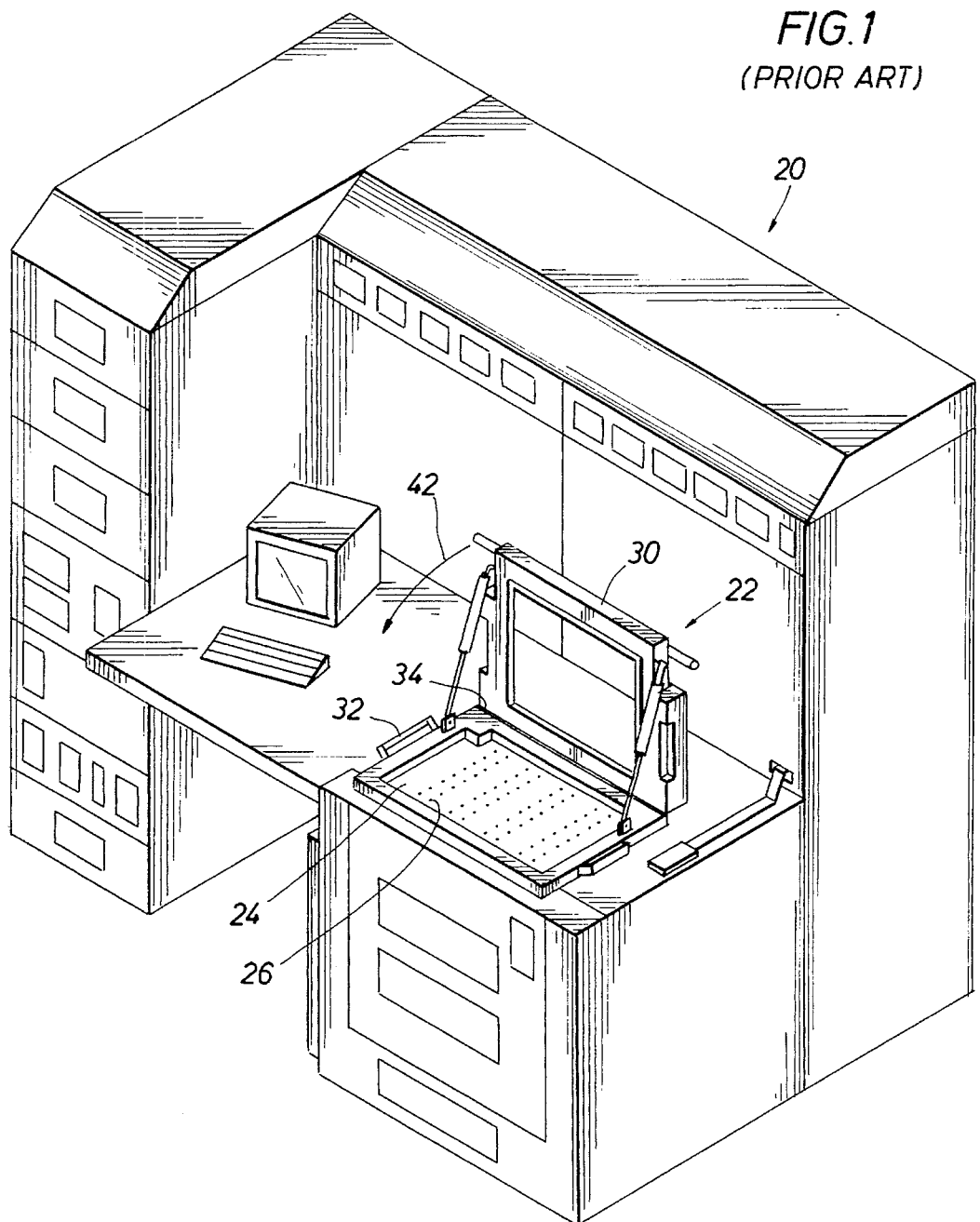
FIG. 1 shows a perspective view of a tester equipped with the handler unit of prior art.

Turning now to the drawings, FIG. 1 shows a tester 20 mounted with a dual-access wireless fixture handler 22 according to prior art. The tester 20 is preferably the GENRAD 2272/2282 in-circuit tester, although the present invention may be used with other types of testers. For example, the tester 20 includes a horizontal interface area 24, although it is contemplated that the present invention may also be used with in-circuit testers using vertical interfaces. Furthermore, the present invention may be incorporated on functional testers.

Figure 4A:
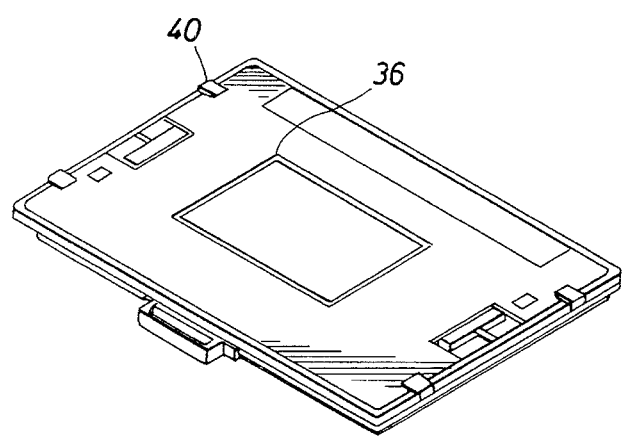
FIG. 4A shows a perspective view of the bottom fixture assembly of prior art for loading into the handler.

The handler 22 is mounted to the tester 20 using mounting means (not shown) as known to those skilled in the art, such as rail guides and screws or bolts. The handler 22 mounts to the tester 20 around a horizontal interface area 24 for electrically interfacing the tester 20 to the test fixture and printed circuit board (PCB) under test 36 (FIG. 4A). The horizontal interface area 24 includes a plurality of upwardly projecting input/output (I/O) pins 26, typically aligned in rows or columns. The I/O pins 26 are preferably spring-loaded for sufficient electrical contact as known to those of ordinary skill in the art.

The handler 22 comprises a top access 30 mounted to a bottom frame 32 having a common axis 34 to open and close the fixture assembly. In general, a top fixture assembly 38 (FIG. 3A) is mounted within the top access 30 and a bottom fixture assembly 40 is mounted within the bottom frame 32. The PCB under test 36 is mounted to the bottom fixture assembly 40. The top access 30 is then lowered in the direction of an arrow 42, pivoting downwards to sandwich the PCB under test 36 between the bottom fixture assembly 40 and the top fixture assembly 38. The tester 20 includes a vacuum-operated actuation system (not shown) which forces the top fixture assembly 38 and bottom fixture assembly 40 to electrically engage the PCB under test 36, and to electrically engage the I/O pins 26 of the tester 20. The force applied may be direct through suction or vacuum between the top and bottom assemblies, or indirect by vertically moving presser bar members (not shown) to mechanically effect engagement between the PCB under test 36 and the tester 20.

Figure 2:
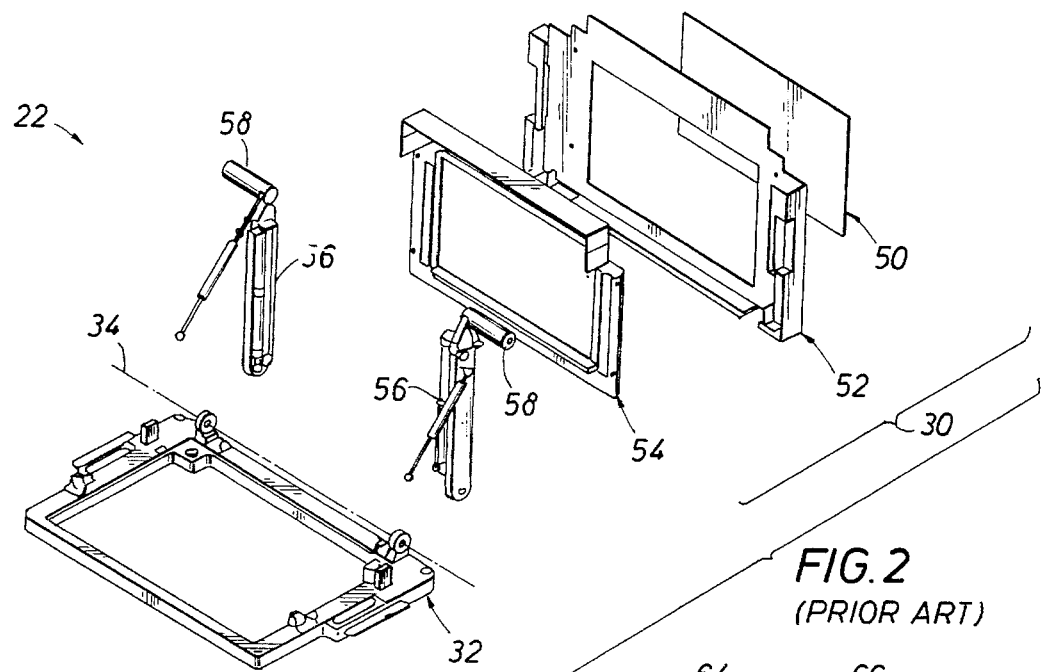
FIG. 2 is an exploded perspective view of the handler of FIG. 1 removed from the tester.

Referring now to FIG. 2, an exploded perspective view of the handler 22 is shown illustrating its various components. In particular, the handler 22 includes a safety cover 50, a main cover 52 and a stiffener 54 sandwiched and mounted together to comprise the top access 30. Hinge units 56, each including handles 58, are used to mount the top access 30 to the bottom frame 32 and to implement pivot movement between the top access 30 and the bottom frame 32 along the axis 34.

Figure 3B:
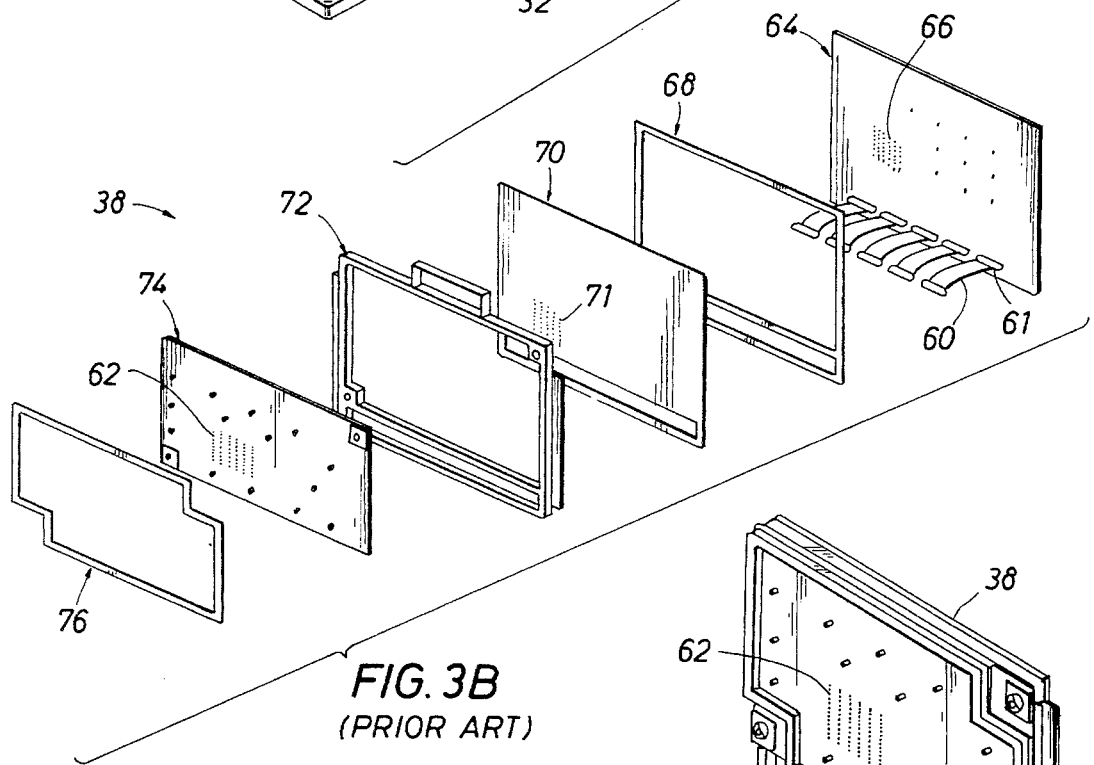
FIG. 3B is an exploded perspective view of the top fixture assembly of FIG. 3A showing its various components.
Figure 3A:
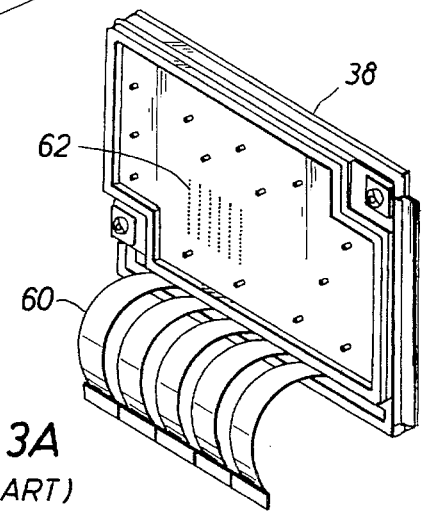
FIG. 3A shows a perspective view of a top fixture assembly of prior art for loading into the handler.

Referring now to FIGS. 3A and 3B, FIG. 3A illustrates the top fixture assembly 38 for electrically interfacing with the test points or pads 37 on the top side 36a of the PCB under test 36. In particular, double-ended pogo pins, referred to as probes or test pins 62, are mounted within the top fixture assembly 38 for electrically engaging the test pads 37.

Referring now to FIG. 3B, an exploded perspective view of the top fixture assembly 38 is shown illustrating its various components. The top fixture assembly 38 includes a top interface printed circuit board (IPCB) 64, which includes test pads 66. The test pads 66 are electrically connected through traces on the top IPCB 64 to connectors 61 mounted on the top IPCB 64. One end of each of the ribbon cables 60 is plugged into a corresponding one of the connectors 61. The top fixture assembly 38 includes a spacer 68, an alignment plate 70, another spacer 72, a probe plate 74 and a seal spacer 76, all mounted together in the order listed and as shown in FIGS. 3A and 3B. The mounting means is typically achieved using metal screws. The probe plate 74 is mounted with the double-ended pogo pins forming test pins 62, so that one end of each test pin 62 electrically engages a corresponding test Pad 37 on the top side of the PCB under test 36, while the opposite end of each test pin 62 electrically engages corresponding test pads 66 on the top IPCB 64. The spacer plates 68 and 72 separate the probe plate 74 from the top IPCB 64, for appropriate compression of the test pins 62. The alignment plate 70 includes holes 71 which correspond with the test pins 62 to appropriately align the test pins 62 with the test pads 66.

Figure 4B:
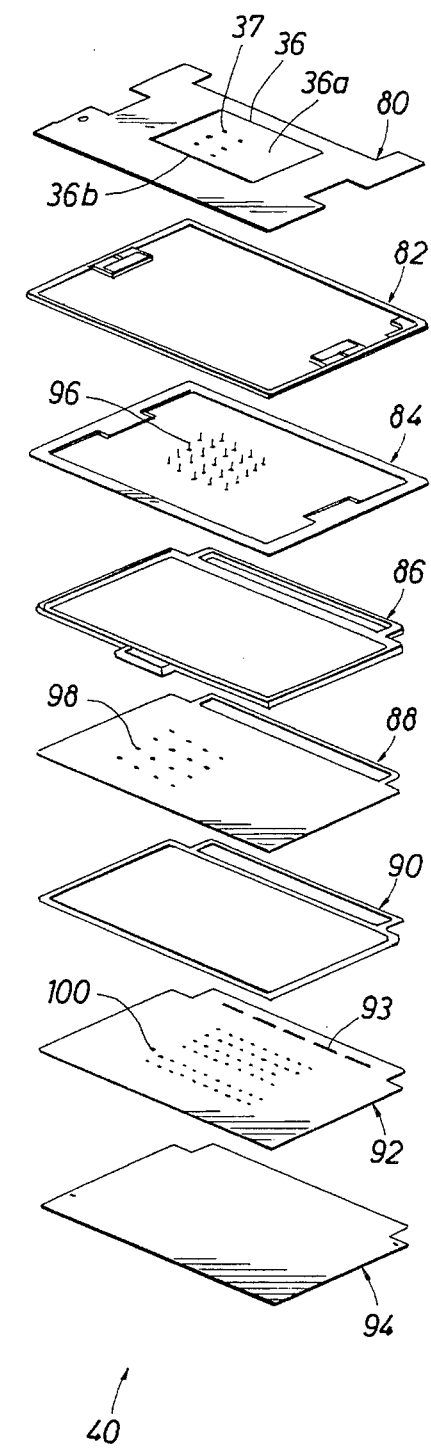
FIG. 4B is an exploded perspective view of the bottom fixture assembly of FIG. 4A, illustrating its various components.

Referring now to FIGS. 4A and 4B, FIG. 4A shows the bottom fixture assembly 40 mounted with the PCB under test 36. FIG. 4B is an exploded perspective view of the bottom fixture assembly 40 illustrating its various components. In particular, the bottom fixture assembly 40 includes a top plate 80 appropriate for mounting the PCB under test 36, a dress ring 82 mounted with dress rails, a probe plate 84 mounted with double-ended pogo pins, referred to as test pins 96, a spacer 86, an alignment plate 88, another spacer 90, a bottom IPCB 92 and a removable board cover 94. The removable board cover 94 is used to protect the bottom IPCB 92 during storage. These various components are mounted together in the order listed and as shown in FIGS. 4A and 4B. The bottom IPCB 92 includes connectors 93, where the other end of each of the ribbon cables 60 is plugged into a corresponding one of the connectors 93. The test pins 96 are similar to the test pins 62, each having one end for electrically engaging corresponding test pads 177 (FIG. 7A) located on the bottom side 36b of the PCB under test 36.

The spacer plates 86 and 90 are used to appropriately space the probe plate 84 from the bottom IPCB 92 at the required distance for a desired compression of the test pins 96. The alignment plate 88 includes a plurality of alignment holes 98 corresponding to the test pins 96 and test pads 100 provided on the upper surface of the bottom IPCB 92. In this manner, the other end of each of the test pins 96 electrically engages a corresponding test pad 100 on the bottom IPCB 92 as properly aligned by the holes 98 on the alignment plate 88. The bottom IPCB 92 includes I/O pads (not shown) along its bottom side aligned with and corresponding to the I/O pins 26 of the tester 20. Thus, the I/O pins 26 electrically engage the test pads along the bottom surface of the bottom IPCB 92 when vacuum is applied. The test pads 100 are electrically connected using electrical traces on the bottom IPCB 92 to the I/O pads on the bottom side of the bottom IPCB 92. In this manner, the I/O pins 26 of the tester 20 are electrically interfaced with the test pads 177 along the bottom surface 36b of the PCB under test 36.

Also, spacer members (not shown) were mounted on the upper surface of the IPCB 92 to attempt to maintain a certain uniform distance between the IPCB 92 and the alignment plate 88. Furthermore, more spacer members (not shown) were provided on the top side of the alignment plate in an attempt to maintain a uniform distance between the alignment plate 88 and the probe plate 84. However, the aggregate distance between the bottom IPCB 92 and the bottom probe plate 84 was not uniform due to tolerance stack up because of the two separate sets of spacers. Thus, the bottom IPCB 92 tended to bow non-uniformly, causing non-uniform compression of the test pins 96.

Several other problems have been experienced while using the handler 22 with the top and bottom fixture assemblies 38 and 40 described above. It is first noted that this prior art fixture is not a true wireless fixture because of the ribbon cables 60 connected between the top and bottom IPCBs 64 and 92. The ribbon cables 60 and their associated connectors 61 cause electrical noise problems, such as wire length or signal overshoot, erratic capacitance or coupled inductance, and inconsistent ground shorts. These wiring problems sometimes caused false signals while the PCB under test 36 was being tested. Consequently, the PCB under test 36 failed even if it was good. Furthermore, the electrical noise problems of the ribbon cables 60 and associated connectors 61 would not allow testing to occur at full speed on high speed PCBs due to maximum frequency limitations. The ribbon cables were very inconvenient, sometimes getting caught or pinched between the top access 30 and the bottom frame 32. This often led to hidden breaks in the wires within the casing of the ribbon cable, which was difficult to detect, leading to debug problems.

Alignment problems were prevalent since the top access 30 and fixture assembly 38 tended to shift relative to the bottom fixture assembly 40, causing misalignment and bent or broken test pins and scratched or damaged test pads 37, 177 on the PCB under test 36. Although guide pins and bushings (not shown) were provided for final alignment after vacuum was applied, there was no pre-alignment before vacuum was applied. Thus, when vacuum was applied, alignment was forced through shifting of the top access B0 and top fixture assembly 38 while the test pins 62, 95 were in contact with the test pads 37, 177, respectively, of the PCB under test 36. The forced alignment was not always successful, so that several adjustments often had to be made, substantially increasing the time required for testing. Sometimes, the necessary adjustments involved manually shifting or even shoving the top access 30 to force alignment while vacuum was applied. The manual adjustments often resulted in damaged test pins and test pads. Although manual adjustment in this manner was not recommended and even discouraged, such adjustment was common among workers in practice to expedite testing.

An inherent alignment problem with the handler 22 also exists, since the top access 30 is pivoted along the axis 34 to engage the bottom frame 32 in a similar manner as the lid on a top-loading washing machine. When closed, but before vacuum was applied, the test pins 62, 96 were brought close to the respective test pads 37, 177 on the PCB under test 36. The single-axis pivot action causes further lateral movement of the test pins 62, 96 when the vacuum is actuated for test due to the pivot motion.

In sum, the forced alignment and further lateral movement caused stress on the guide pins and bushings and a wiping action of the test pins 62 and 96. The test pins 62, 96 were often either bent, broken or worn thereby shortening cycle life of the test fixture. Furthermore, the test pins 92, 96, due to the lateral movement, tended to slide along the test pads 37, 177 on the PCB under test 36, causing damage to the test pads 37, 177. These problems lead to a significant number of test failures, even when the PCB under test 36 was otherwise good. In the field, failure rates of 60 to 70% were experienced.

Figure 5:
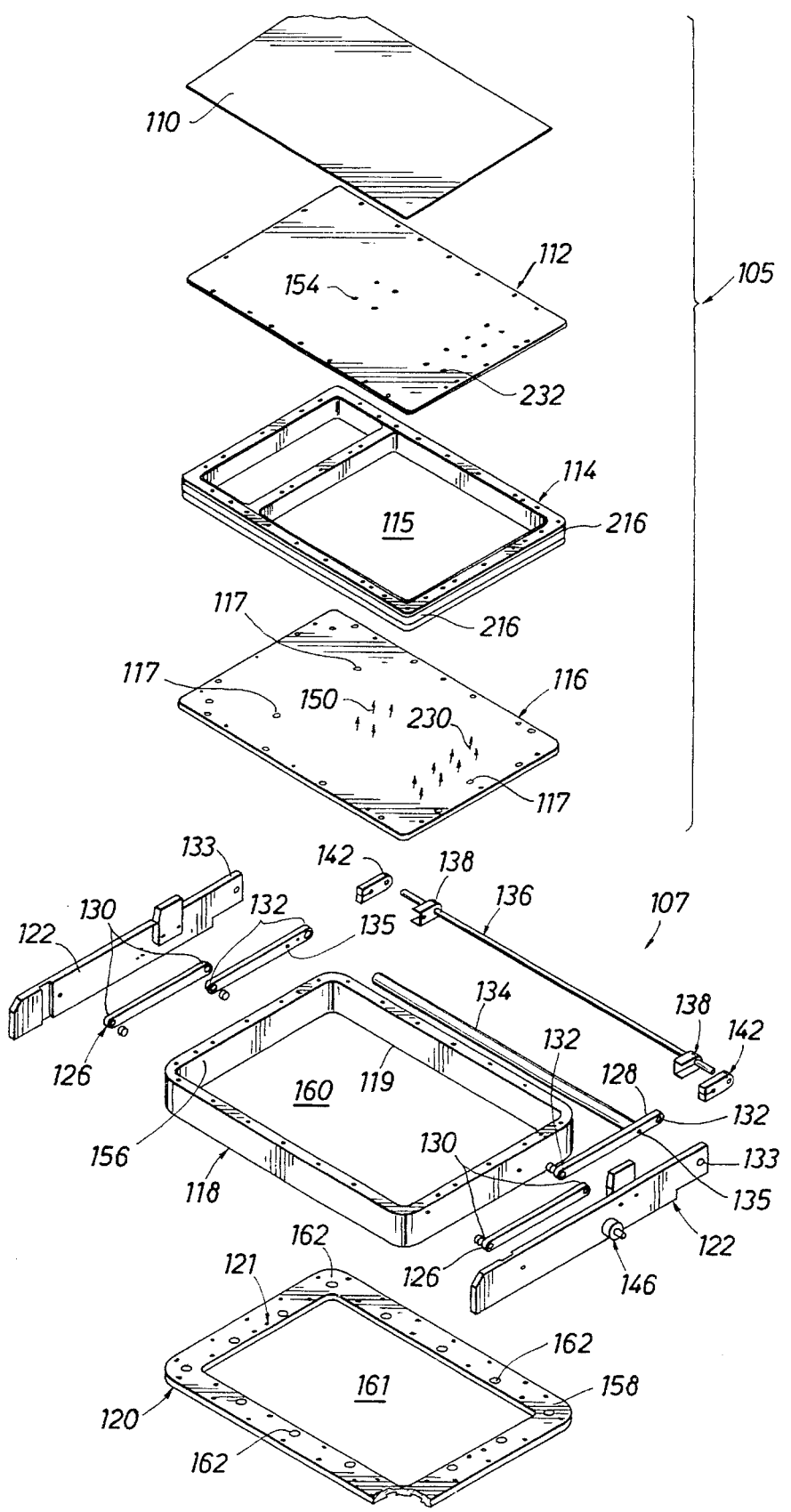
FIG. 5 is an exploded perspective view of a top fixture and frame assembly according to the present invention.

Referring now to FIG. 5, an exploded perspective view of a top fixture assembly 105 and frame assembly 107 according to the present invention is shown. A top IPCB 110, a top alignment plate 112, a top spacer 114 and a top probe plate 116 are preferably screwed together in the order listed and as shown in FIG. 5 to comprise the top fixture 105. Mounting means other than screws may be used. The spacer 114 includes a center opening 115. The top probe plate 116 is preferably made of G-10 material and sanded to hold a ±0.005" tolerance. The top probe plate 116 includes a first set of double-ended pogo pins comprising test pins 150, for electrically engaging test pads 152 (FIG. 7A) located on the bottom side of the top IPCB 110 through the opening 115, in a similar manner as the test pins 62 engage the test pads 66. The top alignment plate 112 includes alignment holes 154, which are aligned with the test pins 150 and test pads 152. In this manner, when the top IPCB 110, the top alignment plate 112, the top spacer 114 and the top probe plate 116 are mounted together, the test pins 150 extend through the alignment holes 154 to contact corresponding test pads 152.

The top probe plate 116 also includes a second set of double-ended pogo pins fashioned as top transfer pins 230, which align with alignment holes 232 drilled through the top alignment plate 112. The top transfer pins 230 electrically engage transfer pads 234 provided on the bottom side of the top IPCB 110 through the opening 115. Electrical traces 236 routed on the top IPCB 110 electrically connect the test pads 152 to the transfer pads 234. The one-piece spacer 114 has a width sufficient to uniformly separate the top probe plate 116 from the top IPCB 110, so that the test pins 150 and transfer pins 230 are sufficiently compressed for appropriate electrical contact to the test pads 152 and the transfer pads 234.

The frame assembly 107 includes a frame support 120, which is mounted to the bottom side 119 of a top frame plate 118 using screws or the like. The top frame plate 118 is a rectangular-shaped tube-like metal body having an opening 160 of the appropriate size and shape to receive the top fixture 105. The frame support 120 is relatively flat and shaped like a picture-frame having a center opening 161, forming a shoulder 121 when mounted to the top frame plate 118. The frame support 120 also includes a plurality of compression springs 162 placed on the shoulder 121 to receive and support the top fixture 105 when placed into the top frame plate 118. The top frame plate 118 includes side walls 156 having a sufficient depth to encompass the top fixture 105. The top spacer 114 includes two strips of silicone foam 216 engaging the sides walls 156 to form a vacuum seal when the top fixture 105 is placed in the frame assembly 107.

Two elongated front rods or links 126 having holes 130 on both ends, have one end pivotally mounted on either side of the top frame plate 118. The opposite hole 130 of the front links 126 are pivotally mounted near the center of two elongated rail supports 122 provided on either side of the top frame plate 118. In like manner, two similar elongated rear links 128 having holes 132 on both ends have one end pivotally mounted near the center of the top frame plate 118. The opposite hole 132 of the rear links 128 are pivotally mounted at corresponding holes 133 at the rear ends of the rail supports 122. A link support bar 134 is mounted between the rear links 128 at holes 135 for mechanical strength and support. The front and rear links 126, 128 are mounted parallel to each other to form a parallel linkage between the rail supports 122 and the top frame plate 118. A pivot bar 136 is included having two rear link support members 138 and two spring mount support bars 142, which mount to the rear links 128 and the rail supports 122, respectively.

The pivot bar 136, link support members 138 and spring mount support bars 142 facilitate raising and lowering the top frame plate 118 and top frame support 120 holding the top fixture 105 relative to the rail supports 122. In this manner, the top fixture 105 is raised in a tackle-box like fashion, always remaining parallel to the rail supports 122.

Figure 6:
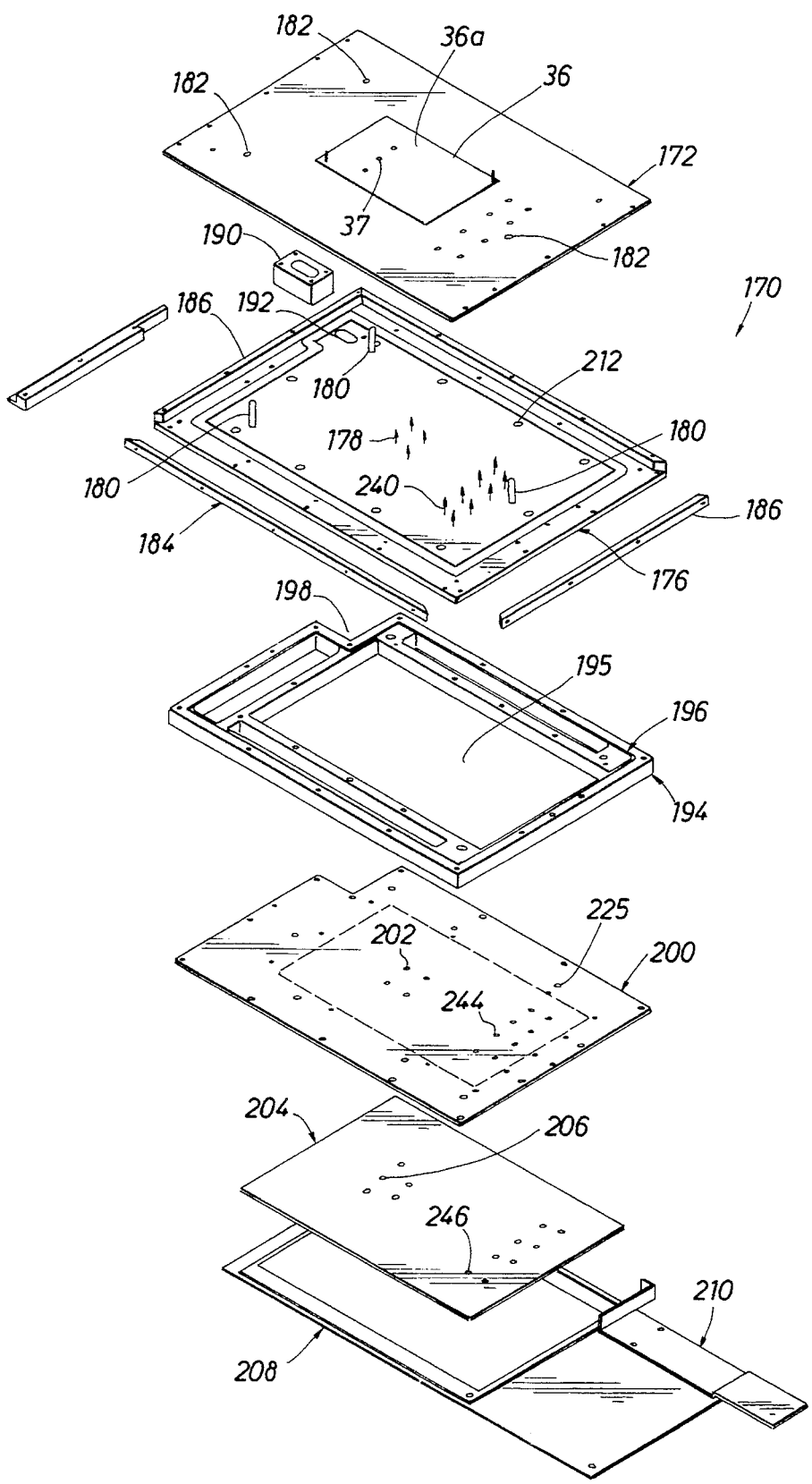
FIG. 6 is an exploded perspective view of a bottom fixture according to the present invention.

Referring now to FIG. 6, an exploded perspective view of a bottom fixture 170 is shown, which is implemented according to the present invention. The bottom fixture 170 according to the present invention includes a top plate 172 mounted with the PCB under test 36. A bottom probe plate 176 is mounted with a first set of double-sided pogo pins 178, in a similar manner as described for the top probe plate 116. The bottom probe plate 176 also preferably comprises G-10 material and is sanded to hold ±0.005" tolerance. The bottom probe plate 176 is mounted with a second set of double-ended pogo pins forming transfer pins 240, which align with alignment holes 182 drilled through the top plate 172 to electrically engage the transfer pins 230, as will be described more fully below.

The bottom probe plate 176 includes compression springs 212 located on its top side. The bottom probe plate 176 preferably includes three guide pins 180, which are aligned to engage with three corresponding holes 182 drilled through the top plate 172. Thus, when the top plate 172 is placed on top of the bottom probe plate 176, it is pre-aligned with the bottom probe plate 176 due to the guide pins 180 and holes 182, and rests on the compression springs 212. The bottom probe plate 176 is also mounted with long dress rails 184 and short dress rails 186 along the edges of the bottom probe plate 176. The top plate 172 includes alignment holes 188 (FIG. 7A) aligned with the test pins 178 to allow access to the test pads 177 located on the bottom side 36b of the PCB under test 36 through the top plate 172. The bottom probe plate 176 is further mounted with a vacuum port 190 mounted to a vacuum interface 192 for access by the vacuum-operated actuation system.

The bottom probe plate 176 is mounted to a bottom spacer plate 194, a bottom alignment plate 200, and a bottom IPCB 204 using metal screws or the like. A seal 196 preferably comprising a U-shaped channel filled with a silicone cord is used to seal the interface between the bottom probe plate 176 and the bottom spacer plate 194. An opening 198 is formed in the bottom spacer plate 194 to facilitate the vacuum port 190. The bottom spacer plate 194 aligns on top of the bottom alignment plate 200, which includes alignment holes 202 corresponding with the test pins 178. The bottom alignment plate 200 is placed on top of the bottom IPCB 204, which includes test pads 206 aligned with the alignment holes 202 to allow the test pins 178 to electrically engage the test pads 206.

Similarly, the bottom alignment plate 200 includes holes 244 aligned with the transfer pins 240, to allow the transfer pins 240 to electrically engage transfer pads 246 provided on the top side of the bottom IPCB 204. The bottom spacer plate 194 includes a central opening 195 for passage of the test pins 178 and the transfer pins 240. Due to the width of the bottom spacer plate 194, the test pins 178 and transfer pins 240 are compressed the appropriate amount to assure the desired electrical contact between the test pins 178 and the transfer pins 240 with the test pads 206 and transfer pads 244, respectively. Finally, the entire assembly is mounted to an adapter plate 208, which includes a rail adapter 210 for mounting the entire fixture assembly to the tester 20 of FIG. 1.

Figure 7A:
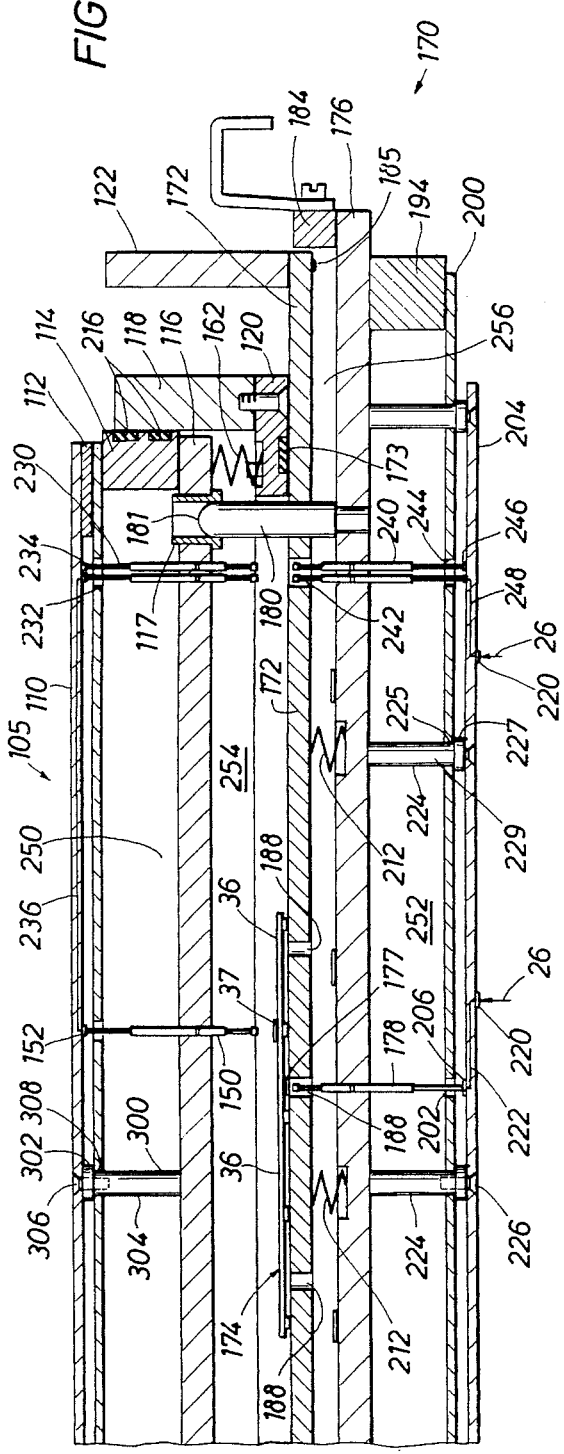
FIG. 7A is a cross-sectional side view of the top and bottom fixtures of FIGS. 5 and 6 while mounted to the tester of FIG. 1 before vacuum is applied.

Referring now to FIG. 7A, a partial cross-sectional side view of the top fixture 105 and frame assembly 107 of FIG. 5 is shown resting on the bottom fixture 170 of FIG. 6, when mounted on the tester 20 and before vacuum is applied. The I/O pins 26 electrically engage corresponding I/O pads 220 provided on the bottom side of the bottom IPCB 204. Electrical traces 222 routed on the bottom IPCB 204 connect the test pads 206 to corresponding ones of the I/O pads 220. In a similar manner, electrical traces 248 routed on the bottom IPCB 204 connect the transfer pads 246 to corresponding ones of the I/O pads 220. Thus, the test pads 202 and transfer pads 244 are electrically interfaced with the I/O pins 26 of the tester 20.

As shown in FIG. 7A, the top frame plate 118 has been lowered relative to the rail supports 122. The frame support 120 rests on the top plate 172 when in the lowered position. A seal means 173 is provided along the bottom of the frame support 120 to assure an appropriate vacuum seal. The top probe plate 116 preferably includes three receptor bushings 117 aligned with the guide pins 180, for the desired alignment of the bottom probe plate 176 with the top probe plate 116. The guide pins 180 preferably include rounded heads 181 to facilitate alignment with the bushings 117 when the frame assembly 107 is in the lowered position. It is noted that prior to the application of vacuum as shown in FIG. 7A, the rounded heads 181 of the guide pins 180 already penetrate the bushings 117 to assure pre-alignment before vacuum is applied.

The rail supports 122 are mounted to the top plate 172 using screws or the like. The top plate 172, mounted with the rail supports 122, aligns inside the dress rails 184, 186. Seal means 185, such as foam rubber, silicone, pouron or the like, is provided on the top of the bottom probe plate 176. The seal means 185 preferably contacts the bottom side of the top plate 172 and is slightly compressed when the top plate 172 rests on the compression springs 212. The test pins 150 align with the test pads 37 on the top side of the PCB under test 36, and the test pins 178 align with the alignment holes 188 in the top plate 172 to appropriately align with the test pads 177 on the bottom side of the PCB under test 36. Also, the transfer pins 230 are longitudinally aligned with the transfer pins 240 before vacuum is applied. It is appreciated that the top plate 172 may only move longitudinally downwards compressing the springs 212 when vacuum is applied due to the guide pins 180. Further, the top fixture 105 may only move longitudinally downwards, due to the top spacer 114 slidably engaging the top frame plate 118 through the silicone foam strips 216, and also due to the guide pins 180. In this manner, there is no lateral movement of the test pins 150, 178 relative to the test pads 37, 177, respectively, on the PCB under test 36. Also, there is no lateral movement of the transfer pins 230, 240 relative to each other when vacuum is applied. Thus, there is no forced alignment between the top fixture 105 and bottom fixture 170 after vacuum is applied, extending the operative life of the test and transfer pins 150, 178, 230 and 240, as well as the test pads 37, 177.

A plurality of one-piece, T-shaped hard stops 224 are mounted to the bottom IPCB 204 Using screws 226 or the like. A base member 227 is integrally formed with a narrower pole member 229 to comprise each of the hard stops 224. The pole member 229 of each of the hard stops 224 extends through the bottom alignment plate 200 through corresponding holes 225 to-engage the bottom side of the bottom probe plate 176. The base member 227 has a greater diameter than the holes 225, forming a shoulder. The height of the base member 227 is sufficient to provide appropriate spacing between the bottom probe plate 204 and the bottom alignment plate 200. Furthermore, the length of the hard stops 224 including the base member 227 and the pole member 229 is sufficient to space the bottom IPCB 204 from the bottom probe plate 176, to assure the appropriate compression of the test pins 178 and the transfer pins 240. Due to the one-piece construction of the hard stops 224, they provide appropriate support and uniform spacing between the bottom probe plate 176 and the bottom IPCB 204. In fact, this critical spacing is maintained to within a tolerance of ±0.005 inches.

Similarly, a plurality of one-piece hard stops 300 are mounted to the top IPCB 110 using screws 306 or the like. A base member 302 is integrally formed with a narrower pole member 304 to comprise each of the hard stops 300, similar to the hard stops 224. The pole member 304 extends through the top alignment plate 112 through corresponding holes 308 to engage the top side of the top probe plate 116. The base member 302 has a greater diameter than the holes 308, forming a shoulder. The height of the base member 302 is sufficient to provide appropriate spacing between the top probe plate 116 and the top alignment plate 112. The length of the hard stops 300 including the base member 302 and the pole member 304 is sufficient to space the top IPCB 110 from the top probe plate 116, to assure the appropriate compression of the test pins 150 and the transfer pins 230. Due to the one-piece construction of the hard stops 300, they provide appropriate support and uniform spacing between the top probe plate 116 and the top IPCB 110. This critical spacing is maintained to within a tolerance of ±0.005 inches.

Figure 7B:
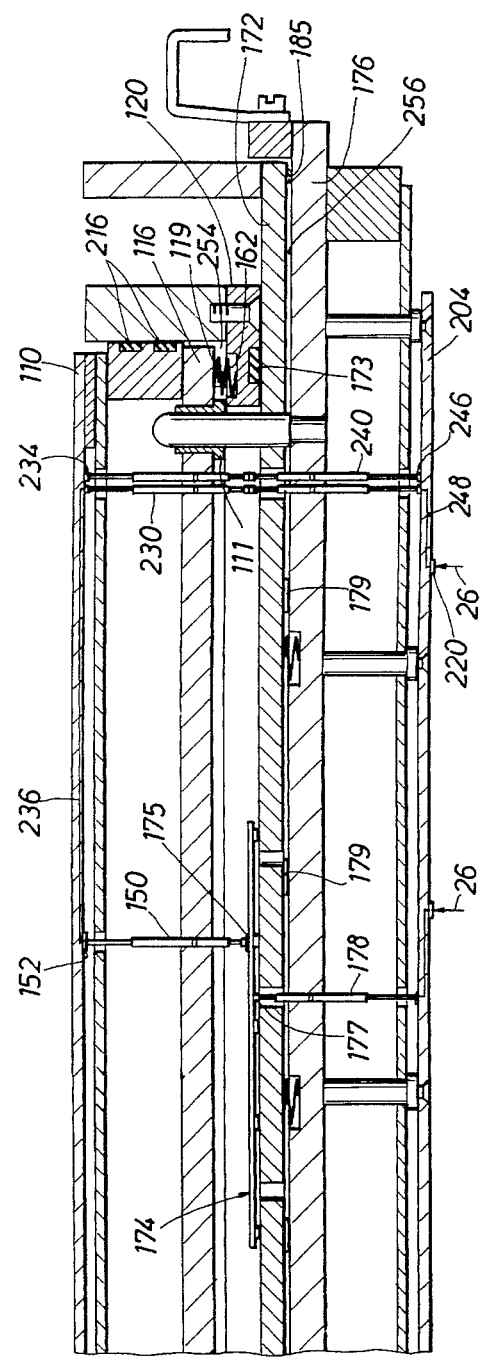
FIG. 7B is a cross-sectional side view of the top and bottom fixtures of FIGS. 7A after vacuum is applied for testing purposes.

Referring now to FIG. 7B, a cross-sectional side view of the top and bottom fixtures 105, 170 of FIGS. 7A is shown after vacuum is applied. The top probe plate 116 and the bottom probe plate 176 are appropriately sealed throughout their length and width to prevent air penetration from an area 250 within the top spacer 114, or from an area 252 between the bottom probe plate 176 and the bottom alignment plate 200. The guide pins 180 and the bushings 117 are milled to tight tolerances to prevent significant passage of air. In this manner, an area 254 between the top probe plate 116 and the top plate 172, and an area 256 between the top plate 172 and the bottom probe plate 176 are compression areas when a vacuum is applied to the vacuum port 190.

The seal formed between the top spacer 114 and the top frame plate 118 using the silicone foam rails 216, and the seal provided by the seal means 173 and 185 allows the vacuum to force the top fixture 105 towards the frame 107, and also to force the top plate 172 and the frame 107 towards the bottom probe plate 176 when vacuum is applied. The seal means 185 is fully compressed when vacuum is applied completing a tighter seal to maintain vacuum. A shoulder 111 integrally formed on the bushings 117, and spacer tabs 119 provided on the frame support 120, prevents the top probe plate 116 from directly contacting the frame support 120. Furthermore, spacer tabs 179 provided along the surface of the bottom probe board 176 prevent the top plate 172 from directly contacting the bottom probe plate 176.

The test pins 150 are brought into electrical engagement with the test pads 37 on the top side 36a of the PCB under test 36, and the test pins 178 are brought into electrical engagement with the test pads 177 on the bottom side 36b of the PCB under test 36. Likewise, the top transfer pins 230 are brought into electrical engagement with the bottom transfer pins 240 to provide electrical interface between the transfer pads 234 on the top IPCB 110 and the transfer pads 246 on the bottom IPCB 204. In this manner, an electrical interface is made between the corresponding test pads 37 on the top side of the PCB under test 36 to the tester 20, through the test pins 150, the test pads 152, the traces 236, the transfer pads 234, the transfer pins 230, 240, the transfer pads 246, the corresponding electrical traces 248, the I/O pads 220 and the I/O pins 26. Thus, complete wireless electrical paths are provided from the test pads 37 of the PCB under test 36 to the tester 20. Of course, the test pins 178 also electrically engage the test pads 177 on the bottom side 36b of the PCB under test 36 when vacuum is applied.

Figure 8A:
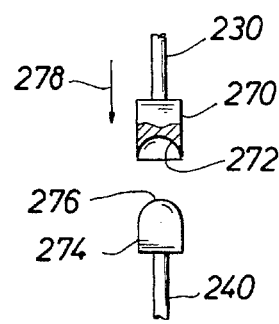
FIG. 8A is a side view showing the contacting ends of upper and lower transfer probes according to the present invention before electrical contact.
Figure 8B:
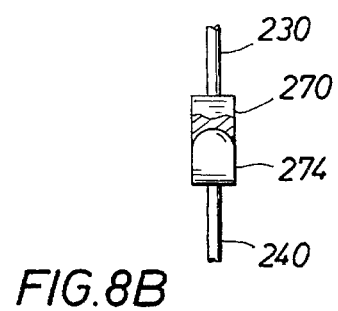
FIG. 8B is a side view showing the transfer probes of FIG. 8A during electrical contact while vacuum is applied.

Referring to FIGS. 8A and 8B, a more detailed diagram of portions of the top and bottom transfer pins 230, 240 are shown. FIG. 8A corresponds to FIG. 7A before vacuum is applied, where the transfer pins 230 and 240 are not in contact. The transfer pin 230 includes a head 270 preferably having a concave contact 272 facing of the bottom transfer pin 240. The bottom transfer pin 240 includes a head 274 preferably having a convex contact 276 for electrically engaging the concave contact 272 of the top transfer pin 230. When vacuum is applied, the top transfer pins 230 are forced longitudinally downwards as indicated by an arrow 278, to contact the bottom transfer pins 240. In FIG. 8B, mechanical and electrical contact is achieved between the heads 270, 274 of the transfer pins 230, 240, respectively.

The convex and concave contact portions 272, 276 of the transfer pins 230, 240 provide several advantages. First, any slight misalignment between the top transfer pins 230 and the bottom transfer pins 240 is adjusted when the contact portions 272 and 276 mate together as shown in FIG. 8B. Furthermore, due to the concave shape of the contact 272 facing downwards, it is less likely to become contaminated with build-up than a flat or convex contact. Thus, the contacts 272, 276 remain cleaner for a longer period of time.

The advantages of the present invention can now be appreciated to those of ordinary skill in the art of PCB testing. The transfer pins 230 on the top probe plate 116 and the transfer pins 240 on the bottom probe plate 176 are located outside of the periphery of the PCB under test 36 and are aligned for electrical engagement with each other when vacuum is applied. Since the transfer pins 240, 230 electrically engage corresponding transfer pads 234, 246, a dual access fixture is achieved without the use of wires. This substantially reduces electrical noise and further allows the tests to be performed at full speed, which is especially important for high speed PCBs.

A frame assembly 107 including the top frame plate 118 containing the top fixture 105 is mounted directly to the top plate 172 through rail supports 122. The action of the parallel front and rear links 126, 128 keep the top fixture 105 parallel to the PCB under test 36. The bottom probe plate 176 includes guide pins 180 aligning with corresponding holes 182 on the top plate 172, so that the top plate 172 and mounted PCB under test 36 are always pre-aligned with the test pins 178 and transfer pins 240 mounted on the bottom probe plate 176. Furthermore, due to the top frame plate 118 and the engagement of the guide pins 180 with the bushings 117 when the frame assembly 107 is lowered into plate prior to testing, the top fixture 105 is also pre-aligned with the bottom probe plate 176 and with the test pins 178 and transfer pins 240. The test pins 150 and the transfer pins 230 are pre-aligned with the PCB under test 36 and the transfer pins 240, respectively.

The pre-alignment and longitudinal-only movement of the assembly when vacuum is applied prevents lateral movement which otherwise causes significant damage to test pins and test pads. The entire fixture lasts much longer and achieves significantly more reliable tests than prior fixtures. In fact, a fixture according to the present invention as described above achieves 75% or more passed PCBs, whereas the same PCBs only passed at a rate of 20–30% due to poor testing techniques of prior test fixtures.

Having described the invention above, various modifications of the techniques, procedures, material and equipment will be apparent to those in the art. It is intended that all such variations within the scope and spirit of the appended claims be embraced thereby.

I claim:

1. A wireless dual-access fixture for electrically interfacing test pads located on a first and a second side of a PCB under test to I/O pins of a tester, the fixture comprising:
   a first interface PCB for electrically interfacing the I/O pins of the tester with the test pads of the PCB under test, comprising:
      a first set of test pads for electrically interfacing the test pads located on the first side of the PCB under test,
      a first set of transfer pads for electrically interfacing the test pads located on the second side of the PCB, under test
      a plurality of I/O pads for electrically engaging the I/O pins of the tester, and
      electrical traces for electrically connecting said first set of test pads and said first set of transfer pads to said plurality of I/O pads;
   a first probe plate, comprising:
      a first set of test pins, each having a first end for electrically engaging a corresponding one of said first set of test pads of said first interface PCB and a second end for electrically engaging a corresponding test pad located on the first side of the PCB under test, and
      a first set of transfer pins, each having a first end for electrically engaging a corresponding one of said first set of transfer pads of said first interface PCB and a second end;
   a second probe plate, comprising:
      a second set of test pins, each having a first end for electrically engaging a corresponding test pad located on the second side of the PCB under test and a second end,
      a second set of transfer pins, each having a first end for electrically engaging said second end of a corresponding one of said first set of transfer pins and a second end; and
   a second interface PCB for electrically interfacing the I/O pins of the tester with the test pads located on the second side of the PCB under test, comprising:
      a second set of test pads, each for electrically engaging said second end of a corresponding one of said second set of test pins,
      a second set of transfer pads, each for electrically engaging said second end of a corresponding one of said second set of transfer pins, and
      electrical traces for electrically connecting said second set of test pads to said second set of transfer pads.

2. A wireless dual-access fixture for electrically interfacing I/O pins of a tester with PCB test pads located on a first side and a second side of a PCB, the fixture comprising:
   a first interface PCB positioned parallel to the PCB having a first side facing the first side of the PCB, comprising:
      a first set of test pads located on said first side of said interface PCB, each one of said first set of test pads being longitudinally aligned with a corresponding one of the PCB test pads located on the first side of the PCB,
      a first set of transfer pads for electrically interfacing the PCB test pads located on the second side of the PCB,
      a plurality of I/O pads located on said second side of said interface PCB for electrically engaging the I/O pins of the tester, and
      electrical conductors routed on said first interface PCB for electrically connecting each one of said first set of test pads and said first set of transfer pads to a corresponding one of said plurality of I/O pads;
   a first probe plate interposed between the first side of the PCB and said first side of said first interface PCB, comprising:
      a first set of test pins orthogonally aligned between said first set of test pads and the PCB test pads on the first side of the PCB, each one of said first set of test pins having a first end for electrically engaging a corresponding one of said first set of test pads of said first interface PCB and a second end for electrically engaging a corresponding PCB test pad located on the first side of the PCB, and
      a first set of transfer pins orthogonally aligned with said first set of transfer pads, each one of said first set of transfer pins having a first end for electrically engaging a corresponding one of said first set of transfer pads of said first interface PCB and a second end;
   a second interface PCB positioned parallel to the PCB having a first side facing the second side of the PCB, comprising:
      a second set of test pads located on said first side of said second interface PCB, each one of said second set of test pads being longitudinally aligned with a corresponding one of the PCB test pads on the second side of the PCB, a second set of transfer pads located on said first side of said second interface PCB, and electrical conductors routed on said second interface PCB for electrically connecting each one of said second set of test pads to a corresponding one of said second set of transfer pads; and a second probe plate interposed between the second side of the PCB and said first side of said second interface PCB, comprising:

a second set of test pins orthogonally aligned between said second set of test pads and the PCB test pads on the second side of the PCB, each one of said second set of test pins having a first end for electrically engaging a corresponding one of the PCB test pads on the second side of the PCB and a second end for electrically engaging a corresponding one of said second set of test pads, and a second set of transfer pins orthogonally aligned with said first set of transfer pads and said first set of transfer pins, each one of said second set of transfer pins having a first end for electrically engaging said second end of a corresponding one of said first set of transfer pins, and a second end for electrically engaging a corresponding one of said second set of transfer pads.

* * * * *